(12) United States Patent
Rosnell

(10) Patent No.: US 7,054,597 B2
(45) Date of Patent: May 30, 2006

(54) POWER CONTROL FOR A TRANSMITTER

(75) Inventor: Seppo Rosnell, Salo (FI)

(73) Assignee: Nokia Corporation, Espoo (FI)

( * ) Notice: Subject to any disclaimer, the term of this patent is extended or adjusted under 35 U.S.C. 154(b) by 458 days.

(21) Appl. No.: 10/603,277

(22) Filed: Jun. 25, 2003

(65) Prior Publication Data

US 2004/0266368 A1 Dec. 30, 2004

(51) Int. Cl.
*H04B 1/04* (2006.01)

(52) U.S. Cl. .................. 455/110; 455/127.3; 375/297; 330/10; 330/124 R

(58) Field of Classification Search ............ 455/67.11, 455/110, 115.1, 115.3, 127.1, 127.2, 127.3; 375/297, 300, 302; 330/10, 124 R, 149, 330/251, 278, 295

See application file for complete search history.

(56) References Cited

U.S. PATENT DOCUMENTS

| | | | |
|---|---|---|---|
| 5,251,330 A | 10/1993 | Chiba et al. | |
| 5,276,912 A | 1/1994 | Siwiak et al. | |
| 5,892,395 A * | 4/1999 | Stengel et al. | .......... 330/124 R |
| 6,147,553 A | 11/2000 | Kolanek | |
| 6,288,606 B1 | 9/2001 | Ekman et al. | |
| 6,295,273 B1 * | 9/2001 | Wakabayashi | .............. 375/302 |
| 6,323,731 B1 | 11/2001 | McCune, Jr. | |
| 6,384,680 B1 | 5/2002 | Takei et al. | |
| 6,611,548 B1 * | 8/2003 | Lomp | .......... 375/148 |
| 6,636,112 B1 * | 10/2003 | McCune | ............. 330/10 |
| 6,690,233 B1 * | 2/2004 | Sander | ............ 330/124 R |
| 6,728,298 B1 * | 4/2004 | Okubo et al. | .......... 375/146 |
| 2002/0079962 A1 | 6/2002 | Sander | |

FOREIGN PATENT DOCUMENTS

| | | |
|---|---|---|
| WO | 9849771 | 11/1998 |
| WO | WO 0106643 | 1/2001 |

\* cited by examiner

*Primary Examiner*—Quochien B. Vuong
(74) *Attorney, Agent, or Firm*—Alfred A. Fressola; Ware, Fressola, Van Der Sluys & Adolphson LLP

(57) ABSTRACT

The invention relates to a transmitter which comprises a modulator providing a phase-modulated constant-envelope radio-frequency signal, and to a method of controlling the power level of a signal output by such a transmitter. In order to enable a power control over a large power range, it is proposed that a provided phase-modulated constant-envelope radio-frequency signal is divided into two identical signals for the power control. A first control arrangement then controls the output power for higher power levels by controlling amplifications applied to the two signals. A second control arrangement controls the output power for lower power levels by controlling phase shifts applied to the two signals. The processed signals are then combined and provided as a power controlled output signal.

23 Claims, 5 Drawing Sheets

POWER CONTROL FOR A TRANSMITTER

FIELD OF THE INVENTION

The invention relates to a transmitter comprising a modulator which provides a phase-modulated constant-envelope radio-frequency signal, for instance an envelope elimination and restoration (EER) transmitter. The invention relates equally to a method for realizing a power control for such a transmitter.

BACKGROUND OF THE INVENTION

In order to enable a transmission of phase and amplitude information of a signal via the radio interface, the signal first has to be converted into a radio-frequency signal comprising the original phase and amplitude information. For such a conversion, EER transmitters offer a better efficiency than traditional IQ-modulator architectures, which makes EER transmitters of particular interest for mobile devices. The better efficiency is achieved especially for linearly modulated signals for which the peak-to-average ratio (PAR) can be quite high.

In an EER transmitter, first the envelope of the signal that is to be transmitted is eliminated. The resulting constant-amplitude phase modulated signal can then be amplified efficiently using very non-linear power amplifiers, such as class-E switching mode power amplifiers. An amplitude modulation of the power amplifier can be used to restore the envelope and thus the amplitude information of the original signal. In practice, this should take place by controlling the supply voltage of the power amplifier in order to preserve its good efficiency. Linear power amplifiers often cannot be modulated in this way, since small changes in their supply voltage do not affect the output signal amplitude.

In most applications, it is required in addition that the average power of the signals output by the transmitter be controlled.

Due to the use of very non-linear power amplifiers, the conventional approach for realizing a power control cannot be used for EER transmitters. In a conventional power control, the power of signals which are input to a power amplifier is adjusted, e.g. by means of a variable gain amplifier, and the adjustment appears correspondingly at the output of the power amplifier. The output power of very non-linear power amplifiers, as employed in EER transmitters, however, is not affected by a change of the input power.

FIG. 1 is a block diagram illustrating schematically a known approach for controlling the output power in an EER transmitter.

The block diagram comprises a modulator 101, which is connected to a highly efficient but very non-linear power amplifier 104. In addition, a battery 111 and a control signal generator 112 are connected to a highly efficient switching mode power supply (SMPS) 113. Instead of the SMPS 113, also a less efficient linear regulator could be used. The output of the SMPS 113 is connected to a supply voltage input of the power amplifier 104.

The modulator 101 provides a radio-frequency signal, which constitutes the phase-modulated part of the desired output signal, for amplification by the power amplifier 104. The control signal generator 112 provides the SMPS 113 at the same time with a control signal which represents a combination of desired amplitude modulation of the output signal and the currently desired power level of the output signal. The SMPS 113 regulates a voltage received from the battery 111 according to the received control signal and provides the resulting voltage to the supply voltage input of the power amplifier 104. The signal provided by the modulator 101 is then amplified by the power amplifier 104 with an amplification factor depending on the current voltage supply. The output of the power amplifier 104 constitutes at the same time the output 'Out' of the EER transmitter.

Thus, the required dynamic range for the amplification has to cover both the desired amplitude variation and the average power level variation. The dynamic range that can be achieved by the SMPS and by the power amplifier, however, is restricted by some lower limit. The lower limit for the power amplifier results from a leakage of the input signal through the power amplifier transistor due to its parasitic capacitances.

In U.S. Pat. No. 6,323,731, it is proposed to employ a dynamic bias control for the power amplifier, in order to widen the output power range compared to the approach of FIG. 1. Nevertheless, the achieved range is still limited.

SUMMARY OF THE INVENTION

It is an object of the invention to enable an improved power control for transmitters. It is in particular an object of the invention to enable an improved power control for transmitters comprising a modulator which provides a phase-modulated constant-envelope radio-frequency signal, like an EER transmitter.

A transmitter is proposed, which comprises a modulator providing a phase-modulated constant-envelope radio-frequency signal and a dividing unit dividing a signal provided by the modulator into a first signal and a second signal which are identical to each other. The proposed transmitter further comprises a first processing branch for processing a respective first signal provided by the dividing unit. The first processing branch includes a first phase shifter and a first power amplifier connected to each other in series. The proposed transmitter further comprises a second processing branch for processing a respective second signal provided by the dividing unit. The second processing branch includes a second phase shifter and a second power amplifier connected to each other in series. The proposed transmitter further comprises a combining unit combining signals provided by said first and said second processing branch. The proposed transmitter further comprises a first control arrangement for controlling the power of a signal output by the combining unit at least for higher power levels by controlling the amplifications applied by the first power amplifier and by the second power amplifier to a respectively received signal. The proposed transmitter further comprises a second control arrangement for controlling the power of a signal output by the combining unit at least for lower power levels by controlling the phase shifts applied by the first phase shifter and by the second phase shifter to a respectively received signal.

Moreover, a method of controlling the power level of a signal output by a transmitter is proposed. The proposed method comprises in a first step dividing a provided phase-modulated constant-envelope radio-frequency signal into a first signal and a second signal which are identical to each other. The proposed method further comprises controlling the power level of an output signal of the transmitter at least in case of higher required power levels by controlling amplifications applied separately to the first signal and to the second signal. The proposed method further comprises controlling the power level of an output signal of the transmitter at least in case of lower required power levels by controlling phase shifts applied separately to the first signal and to the second signal. Finally, the proposed method comprises combining the processed first signal and the processed second signal and providing the combined signal as power controlled output signal.

The invention proceeds from the consideration that if a signal is split up into two signals and then combined again, the power of the combined signal can be controlled as well by controlling the phase of the two split up signals as by controlling the amplitude of the two split up signals. Since for some power amplifiers, the dynamic range in which the amplitude of a radio frequency signal can be adjusted linearly through a power amplifier supply voltage is limited, it is therefore proposed that the power control is realized only at high power levels by adjusting the amplitude of the split up signals. At lower power levels, the power control is realized by adjusting the phase of the split up signals. Controlling the phase causes part of the radio frequency power to turn into heat in the combining unit. Therefore, it is not recommendable to use exclusively a power control adjusting the phase of a split up signal.

It is an advantage of the invention that it enables a linear power control over a larger range, which is also efficient at the critical high power levels.

The proposed adjustment of the amplitude and/or the phase of the split up signals can be used at the same time for applying a desired amplitude modulation to the phase-modulated constant-envelope radio-frequency signal.

The proposed transmitter can be in particular, though not exclusively, an EER transmitter. It could also be a transmitter, for example, which transmits signals that are only phase modulated.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are merely intended to conceptually illustrate the structures and procedures described herein.

DETAILED DESCRIPTION OF THE INVENTION

Figure 1:
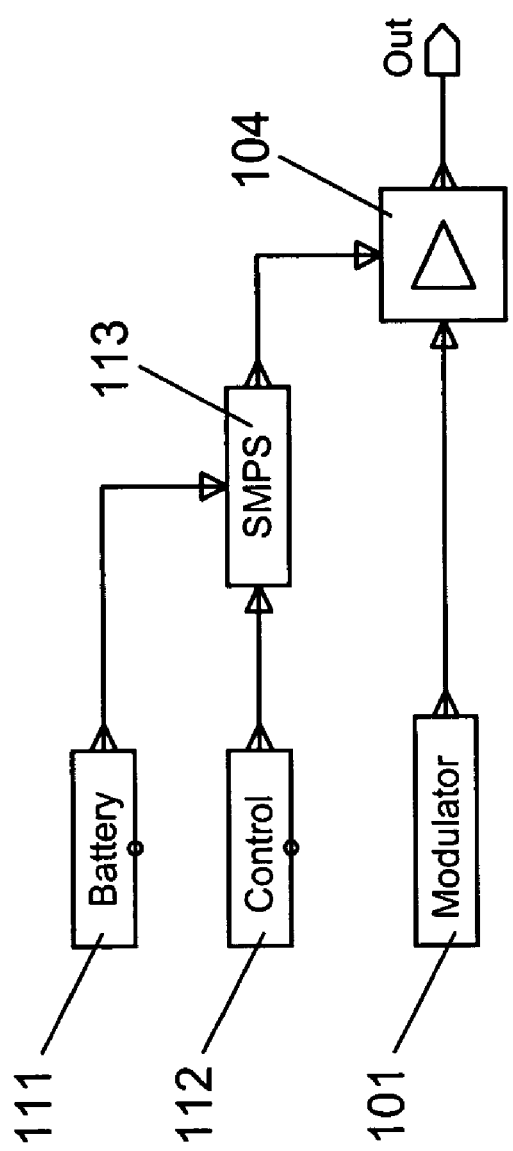
FIG. 1 is a block diagram illustrating a known power control for an EER transmitter.

FIG. 1 has already been described above.

Figure 2:
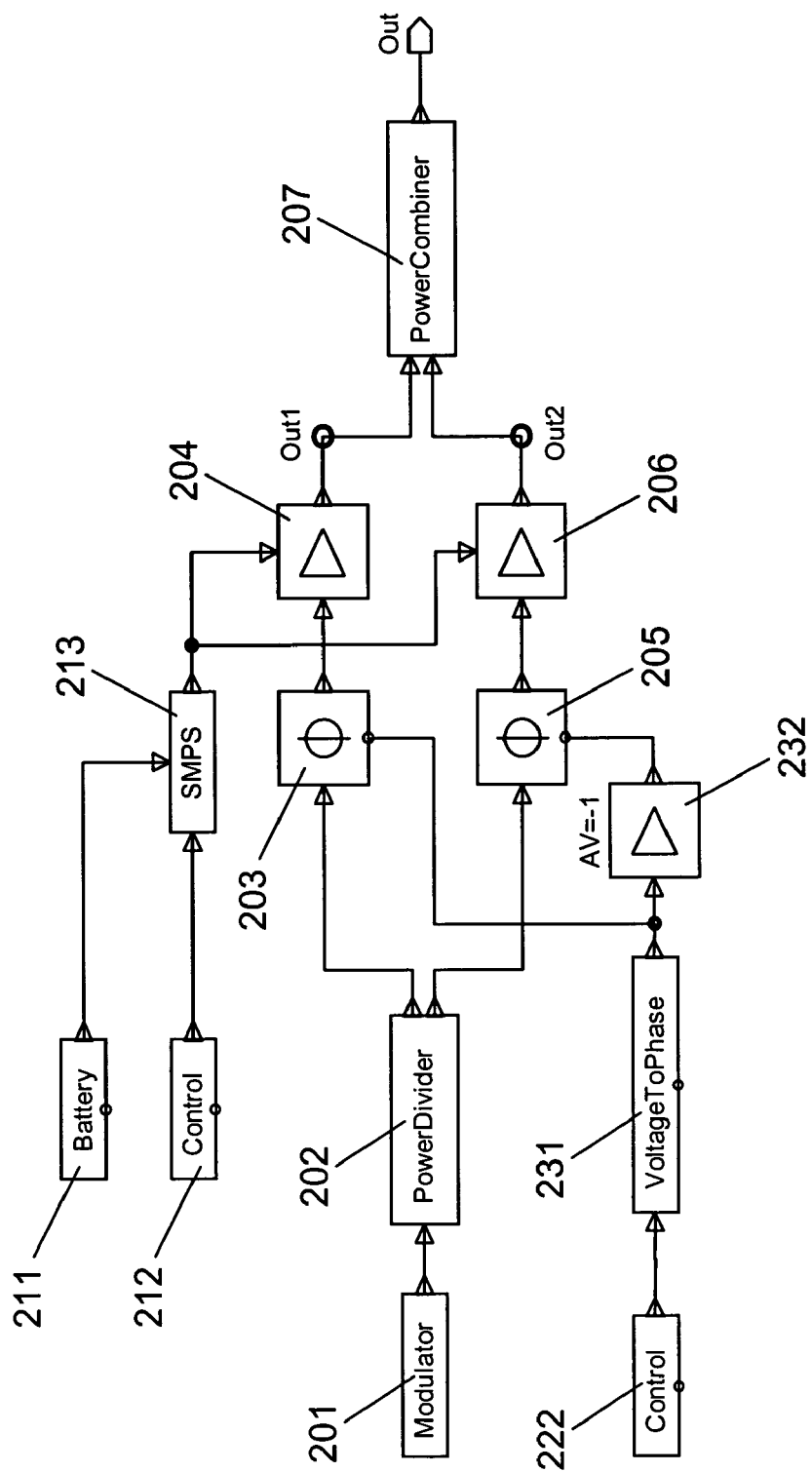
FIG. 2 is a block diagram illustrating a first embodiment of a power control according to the invention.

FIG. 2 is a block diagram presenting selected components of a first embodiment of an EER transmitter according to the invention. The presented components enable an efficient power control for the EER transmitter over a large power range. The EER transmitter may be used for instance in a mobile device.

The EER transmitter of FIG. 2 comprises a modulator 201, the output of which is connected to the input of a power divider 202. A first output of the power divider 202 is connected via a first phase shifter 203 to a signal input of a first E-class power amplifier 204. A second output of the power divider 202 is connected via a second phase shifter 205 to a signal input of a second E-class power amplifier 206. The output of both power amplifiers 204, 206 is connected to a respective input of a power combiner 207, e.g. a Wilkinson power combiner.

The output of the power combiner 207 constitutes at the same time the output 'Out' of the EER transmitter.

The EER transmitter of FIG. 2 comprises in addition a battery 211 and a control signal generator 212, which are both connected to a respective input of an SMPS 213. The output of the SMPS 213 is connected to a respective power supply input of both power amplifiers 204, 206.

The EER transmitter of FIG. 2 moreover comprises a second control signal generator 222, which is connected to an input of a voltage-to-phase converter 231. The output of the voltage-to-phase converter 231 is connected on the one hand to a control input of the first phase shifter 203. On the other hand, the output of the voltage-to-phase converter 231 is connected via an inverter 232 to a control input of the second phase shifter 205

The power control employed for the EER transmitter of FIG. 2 makes use of the fact that when two sinusoidal signals are combined to form a new signal, amplitude A and phase φ of the combined signal can be determined as a function of the amplitudes $A_1$, $A_2$ and phases $\phi_1$, $\phi_2$ of the input signals. That is, if the combined signal is written as the sum of the two sinusoidal signals:

$$A\cos(\omega t+\phi)=A_1\cos(\omega t+\phi_1)+A_2\cos(\omega t+\phi_2), \quad (1)$$

where ω=2πf represents the angular center frequency of the three signals, the amplitude A of the combined signal is given by:

$$A = \sqrt{A_1^2 + A_2^2 + 2A_1 A_2 \cos(\varphi_1 - \varphi_2)} \quad (2)$$

and the phase φ of the combined signal is given by:

$$\varphi = \arctan\left[\frac{A_1\sin(\varphi_1) + A_2\sin(\varphi_2)}{A_1\cos(\varphi_1) + A_2\cos(\varphi_2)}\right] \quad (3)$$

As can be seen, the maximum amplitude of the combined signal $A=A_1+A_2$ is achieved with $\phi_1-\phi_2=0$. That is, by suitably combining two in-phase sinusoidal carriers, the total power of the combined signal is equal to the sum of the powers of the two input signals.

On the other hand, the minimum amplitude of the combined signal $A=|A_1-A_2|$ is achieved with $\phi_1-\phi_2=\pi$. That is, if two sinusoidal carriers having opposite phases are combined, the total power of the combined signal is equal to the difference of the input powers. In order to enable an combined signal having an amplitude A of zero, the input signal amplitudes $A_1$, $A_2$ should thus be equal. Moreover, by requiring that $\phi_2=-\phi_1$ constantly, it can be ensured that the phase φ of the combined signal will not be affected when controlling the amplitude A of the combined signal by an adjustment of the phases $\phi_1$, $\phi_2$ of the input signals, i.e. (φ=0).

The operation of the presented structure will be described in the following.

First, an amplitude signal and a phase modulated radio frequency signal are generated, which can be realized in various ways. For instance, an original complex baseband signal can be divided into its amplitude and phase counterparts. The latter modulates a phase modulator 201 generating a constant-amplitude phase-modulated radio frequency signal. Another possibility would be to eliminate the envelope of the original radio frequency signal to obtain a constant-amplitude phase modulated signal. The constant-amplitude phase modulated signal is then provided to the power divider 202.

The power divider 202 divides the received phase modulated radio frequency signal into two identical radio frequency signals. The first radio frequency signal is phase shifted by the first phase shifter 203 and amplified by the first power amplifier 204. The second signal is phase shifted by the second phase shifter 205 and amplified by the second power amplifier 206.

At the same time, a signal representing the envelope which is eliminated from the original signal is provided to the control signal generator 212. Further, a power control signal representing the currently desired average power of the signal output by the transmitter is provided to the control signal generator 212. If the desired average output power level is a high power level, the control signal generator 212 combines the envelope signal with the power control signal to a single control voltage $V_C$. This control voltage $V_C$ represents an arbitrary value in the range of 0 . . . 1. The value 0 represents a certain minimum power and the value 1 a certain maximum power. If the desired average output power level is a low power level, the first control signal generator 212 generates a control voltage $V_C$ corresponding only to the desired envelope at a lower power level. The respectively generated control voltage $V_C$ is provided by the first control signal generator 212 to the SMPS 213.

In addition, the power control signal representing the currently desired average power of the signal output by the transmitter is provided to the second control signal generator 222. If the desired average output power level is a high power level, the second control signal generator 222 does not generate any control voltage. If the desired average output power level is a low power level, the second control signal generator 222 generates a control voltage $V_C$ corresponding to the desired average power of the signal output. The second control signal generator 222 provides the generated control voltage $V_C$ to the voltage-to-phase converter 231.

The high power level is delimited from the low power level by an intermediate power level, which corresponds to the lower limit of the range in which SMPS 213 and power amplifiers 204, 206 work linearly.

By controlling the transmitter separately for high power levels and low power levels, the output level control is thus divided to two subtasks. The first control signal generator 212 sets the amplitude and the average power at high power levels. At low power levels, the control signal generator 212 only takes care of controlling the amplitude. The second control signal generator 222 is used at low power levels and for average power level control only, and widens thereby the output power range in the direction of low power levels. At low power levels, thus a shared control by the first and the second control signal generator 212, 222 is provided, as the control of the average power is transferred from the control unit 212 to the control unit 222 at the intermediate power level.

Other combinations of a control of the power amplifiers 204, 206 and the phase shifters 203, 205 are possible as well. For example, in theory, it would be possible to use the second control signal generator 222 also for the amplitude generation at lower power levels.

Whenever the control voltage $V_C$ is provided by the first control signal generator 212 to the SMPS 213, the SMPS 213 regulates a voltage supplied by the battery 211 according the received control voltage $V_C$. The regulated voltage is then provided as supply voltage to the respective power supply input of both power amplifiers 204, 206. Both power amplifiers 204, 206 amplify the respectively received signal with a factor which depends on the provided supply voltage. The control voltage $V_C$ is generated such that the resulting power of the signals which are amplified by the power amplifiers 204, 206 is half of the power desired for the output signal of the EER transmitter. Whenever a minimum average control voltage $V_C$ is provided to the SMPS 213, a corresponding minimum supply voltage is provided to the power amplifiers 204, 206, which thus output a minimum radio frequency signal when not utilizing the second control signal generator 222. The battery voltage variations should not affect the SMPS output value. In the basic case, the SMPS output value follows directly the control voltage, but other relationships are possible as well.

Whenever a control voltage $V_C$ is provided by the second control signal generator 222 to the voltage-to-phase converter 231, the voltage-to-phase converter 231 converts the received control voltage $V_C$ into a corresponding phase control signal $V_P$. For this conversion, it is assumed that the power level at the output 'Out' of the EER transmitter in decibel should follow the control voltage $V_C$ linearly. Therefore, the control voltage $V_C$ is converted into a phase control signal $V_P$ according to the following equation:

$$V_P = arccos\{10^{[k(V_c-1)]}\}, \qquad (4)$$

where k represents the desired slope of the output power as a function of control voltage $V_C$.

The obtained phase control signal $V_P$ is then supplied directly to the control input of the first phase shifter 203. In addition, the obtained phase control signal $V_P$ is inverted by the inverter 232, and the inverted phase control signal is supplied to the control input of the second phase shifter 205. The purpose of the inverter 232 is to emphasize that the phases of two phase shifters 203 and 205 should be tuned symmetrically in opposite directions. Each of the phase shifters 203, 205 applies to the signal received from the power divider 202 a phase shift which corresponds to the control signal applied to its respective control input.

Whenever no control voltage $V_C$ is provided to the voltage-to-phase converter 231, no control signal is provided to the respective control input of the phase shifters 203, 205, which thus output the received signals without applying any phase shift. Actually, in this case there should be an equal phase shift $\phi_0$ in both phase shifters 203, 205. It cancels out when calculating the phase difference.

The output 'Out1', 'Out2' of the first and the second amplifier 204, 206 are then combined by the power combiner 207.

In case a control voltage $V_C$ has been provided to the SMPS 213 and not to the voltage-to-phase converter 231, no phase shift has been applied by the phase shifters 203, 205 to the signals provided by the power divider 202. Thus, the phase of the two signals 'Out1', 'Out2' provided to the power combiner 207 is equal, and according to above equation (2), the amplitude of the signal output by the power combiner 207 has a power $A^2$ which is equal to the sum of the powers $A_1^2$ and $A_2^2$, respectively, of the two signals 'Out1', 'Out2'. An impedance level of 1 has been assumed here.

In case a control voltage $V_C$ has been provided to the voltage-to-phase converter 231 and at least a minimum control voltage has been provided to the SMPS 213, the phases $\phi_1$, $\phi_2$ of the signals input to the phase shifters 203, 205 have been tuned in opposite directions. This ensures that the power of the signal output by the power combiner 207 is controlled exclusively by the value of the respective phase shift according to above equation (2). In the current embodiment, the control voltage $V_C$ applied by the first control voltage generator 212 at low power levels to the SMPS 213 shapes only the envelope of the output signal of the EER transmitter.

The combined signal thus constitutes a radio frequency output signal, which is modulated in phase and amplitude according to the original signal.

By using different approaches for a power control depending on the current power level of the output signal of the EER transmitter, the presented structure enables an efficient power control over a large range.

If utmost linearity is desired for the power control, it is also possible to accomplish both enabled power controls simultaneously. At high power levels, however, the efficiency of the power control will be better when performing the power control only by adjusting the amplification factor used by the power amplifiers 204, 206.

The insertion loss of the power combiner 207 decreases the total efficiency of the EER transmitter, but the two power amplifiers 204, 206 can operate at higher impedance levels than a single amplifier. This makes the impedance matching easier and may help to reduce the losses due to the matching network.

Small variations of the phase shifter output levels are not relevant, if the power amplifiers 204, 206 are saturated, which is for example the case with the employed class-E power amplifiers. This helps in the practical design of the phase shifters 203, 205.

Figure 3:
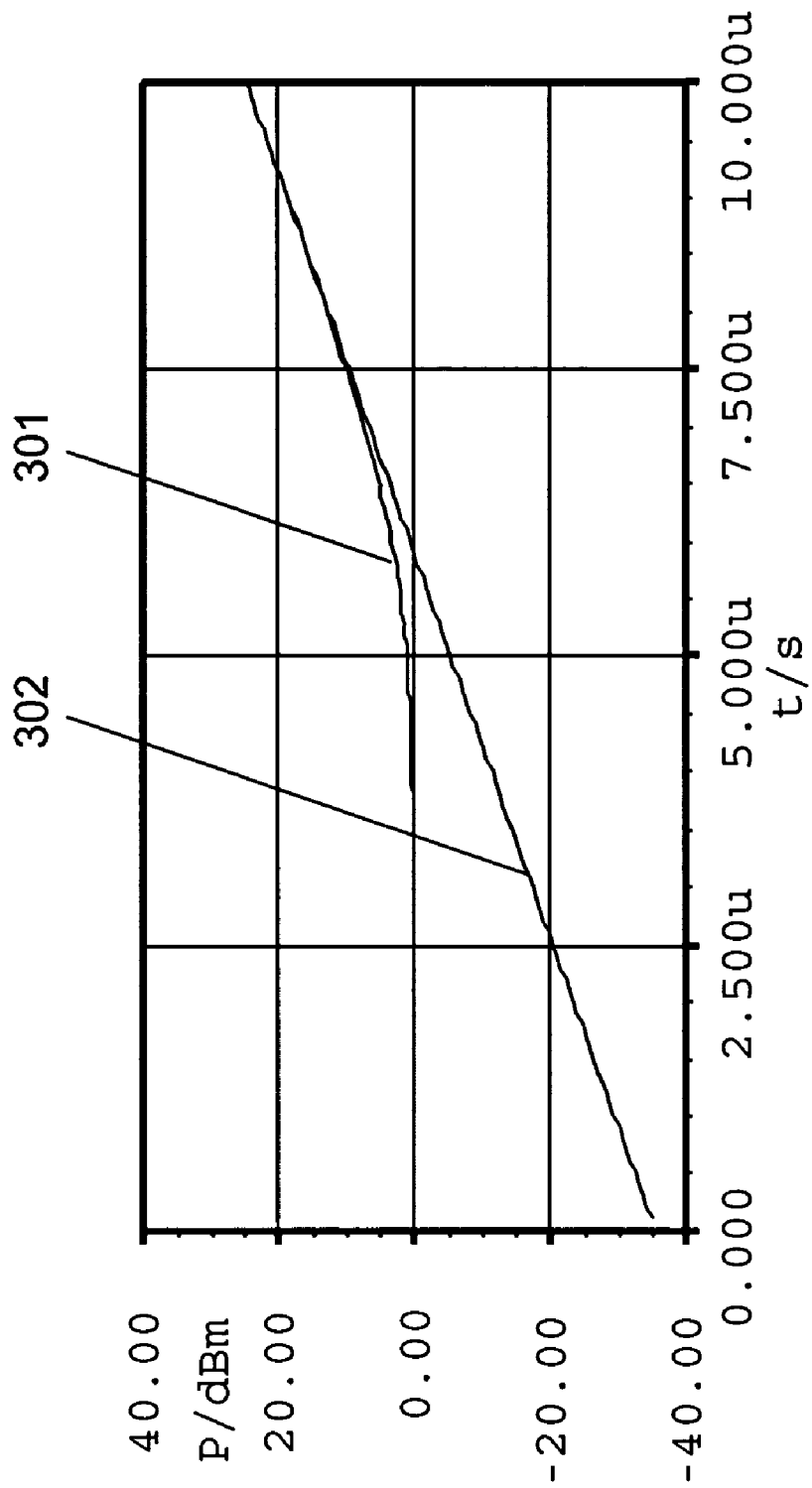
FIG. 3 is a diagram presenting the effect of a possible amplitude error in the power control illustrated in FIG. 2.

It is to be noted, however, that in case the amplitudes of the signals provided to the power combiner 207 are different, the lowest available output power is restricted as mentioned above with reference to equation (2). For an amplitude error of 1 dB and a slope of k=3, the resulting power in dBm is depicted in FIG. 3 as a first curve 301. A second curve 302 represents an errorless situation. The situation is similar, if the signals provided to the power combiner 207 have a difference in their phase shifts.

Figure 4:
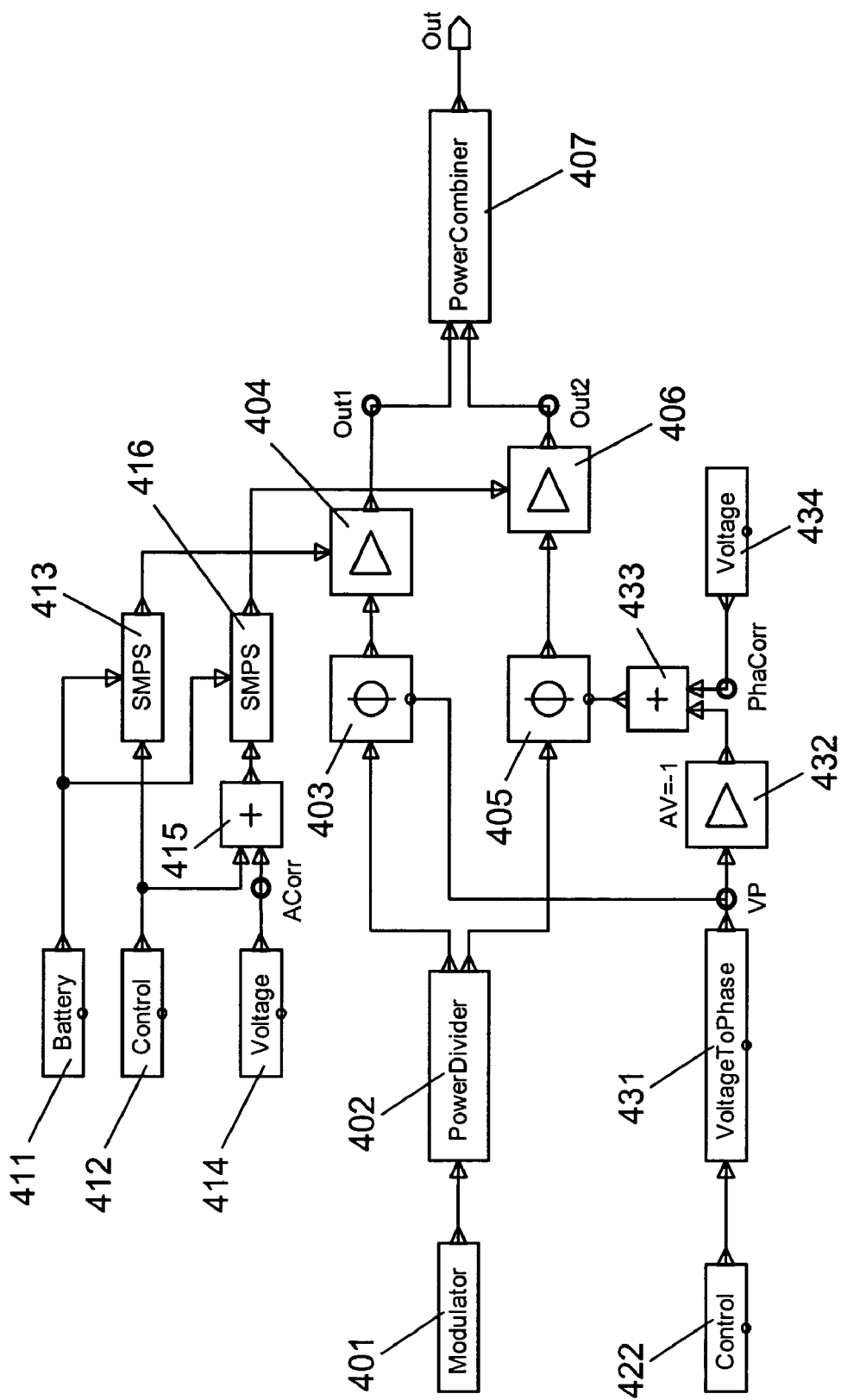
FIG. 4 is a block diagram illustrating a second embodiment of a power control according to the invention.
Figure 5:
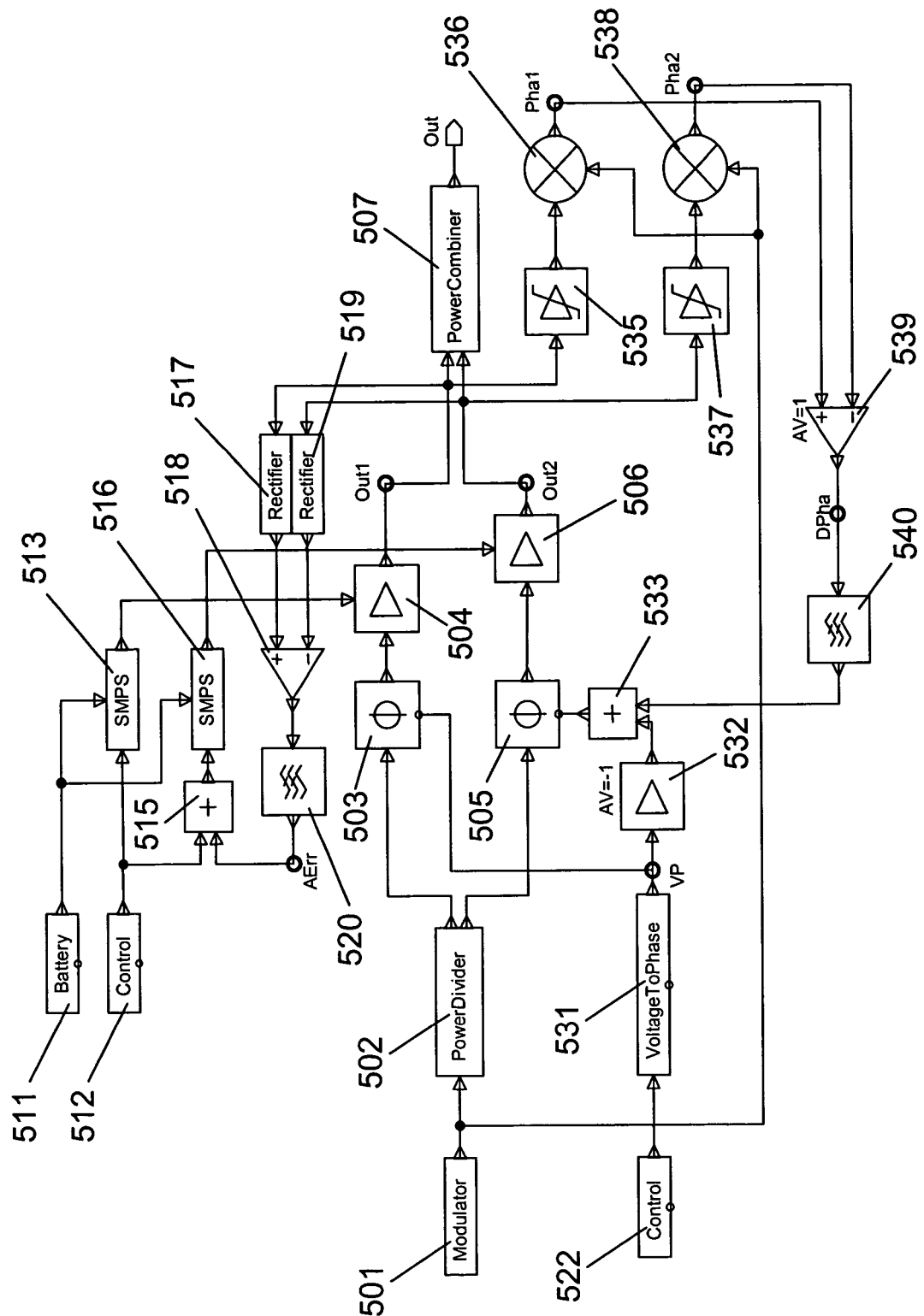
FIG. 5 is a block diagram illustrating a third embodiment of a power control according to the invention.

FIGS. 4 and 5 are block diagrams presenting selected components of a second and a third embodiment of an EER transmitter according to the invention, respectively, which additionally take care of such errors in amplitude and phase.

Like the EER transmitter of FIG. 2, the EER transmitter of FIG. 4 comprises a modulator 401, a power divider 402, a first phase shifter 403, a first E-class power amplifier 404, a second phase shifter 405, a second E-class power amplifier 406 and a power combiner 407. These components are also arranged in the same way as the corresponding components of FIG. 2.

The EER transmitter of FIG. 4 moreover again comprises a battery 411 and a first control signal generator 412, which are both connected to a respective input of an SMPS 413. Here, the output of the SMPS 413 is only connected to the control input of the first power amplifier 404, though. The EER transmitter of FIG. 4 additionally comprises a first voltage generator 414. The voltage generator 414 is connected to a first input of a first summing unit 415, while the output of the first control signal generator 412 is also connected to a second input of this summing unit 415. The output of the summing unit 415 is connected to an input of a second SMPS 416. The battery 411 is also connected to a second input of this second SMPS 416. The output of the second SMPS 416 is connected to the supply voltage input of the second power amplifier 406.

The EER transmitter of FIG. 4 further again comprises a second control signal generator 422, which is connected to an input of a voltage-to-phase converter 431. The output of the voltage-to-phase converter 431 is connected on the one hand again to the control input of the first phase shifter 403. On the other hand, the output of the voltage-to-phase converter 431 is connected via an inverter 432 to a first input of a second summing unit 433. The EER transmitter of FIG. 4 additionally comprises a second voltage generator 434 which is connected to a second input of the summing unit 433. The output of the summing unit 433 is connected to the control input of the second phase shifter 405.

The EER transmitter of FIG. 4 is operated basically just like the EER transmitter of FIG. 2 as described above.

The voltage generators 414, 434, however, are used for adding a suitable constant voltage value ACorr, PhaCorr to the amplitude and the phase control, in order to compensate errors in phase and amplitude.

The single power supply of FIG. 2 was divided to this end into two separated power supplies, one for each switching mode power amplifier 404, 406. While the power supply for the first power amplifier 404 is identical as in the first embodiment, the power supply for the second power amplifier 406 is regulated according to a control voltage $V_C$ which is adjusted by a correction voltage ACorr. This makes it possible to tune the amplifiers 404, 406 independently from each other and, consequently, to correct the amplitude error. Similarly, the first phase shifter 403 is controlled just like in the first embodiment, while the summing unit 433 allows adjustment of the phase control signal $V_P$ provided by the voltage-to-phase converter 431 and inverted by the inverter 432 by a correction voltage PhaCorr, before it is supplied to the control input of the second phase shifter 405. This makes it possible to control the phase shifts applied by the phase shifters 403, 405 independently from each other and, consequently, to correct the phase error.

A suitable calibration procedure can be used to set the amplitude and phase error compensation voltages ACorr, PhaCorr provided by the voltage generators 414, 434 to appropriate levels.

The EER transmitter presented in FIG. 5 can be employed in case a continuous tuning of the amplitude and phase error compensation voltages is desired instead of a fixed error correction.

Just like the EER transmitter of FIG. 4, also the EER transmitter of FIG. 5 comprises a modulator 501, a power divider 502, a first phase shifter 503, a first E-class power amplifier 504, a second phase shifter 505, a second E-class power amplifier 506, a power combiner 507, a battery 511, a first control signal generator 512, a first and a second SMPS 513, 516, a first summing unit 515, a second control signal generator 522, a voltage-to-phase converter 531, an inverter 532 and a second summing unit 533. These components are all arranged exactly in the same way as the corresponding components of FIG. 4.

Instead of the first and second voltage generator 414, 434 of FIG. 4, however, a respective feedback circuit is provided for correcting amplitude and phase errors.

For the amplitude correcting feedback circuit, the output of the first power amplifier 504 is connected via a first rectifier 517 to a non-inverting input of a subtractor 518, while the output of the second power amplifier 506 is connected via a second rectifier 519 to an inverting input of the subtractor 518. Since the signals output by the rectifiers 517 and 519 represent the current amplitudes of the signals 'Out1', 'Out2' provided to the power combiner 507, the signal output by the subtractor 518 represents the current difference in amplitude between the signals 'Out1', 'Out2'. The output of the subtractor 518 is provided via a low pass filter 520 to the first input of the first summing unit 515. The amplitude correction signal input to the first summing unit 515 thus corresponds always to the current amplitude error.

For the phase correcting feedback circuit, the output of the first power amplifier 504 is connected via a first limiter 535 to a first input of a first mixer 536, while the output of the second power amplifier 506 is connected via a second limiter 537 to a first input of a second mixer 538. In addition, the output of the modulator 501 is connected to a respective second input of the first and the second mixer 536, 538. The output of the first mixer 536, which represents a voltage 'Pha1' related to an absolute phase shift of the signal 'Out1' versus the signal provided by the modulator 501, is connected to a non-inverting input of a second subtractor 539. The output of the second mixer 538, which represents a voltage 'Pha2' related to the absolute phase shift of the signal 'Out2' versus the signal provided by the modulator 501, is connected to an inverting input of this subtractor 539. The difference between the two voltages 'Pha1' and 'Pha2' output by the subtractor 539 is provided via a second low pass filter 540 to the second input of the second summing unit 533. The phase correction signal input to the second summing unit 533 thus corresponds always the current phase error. The voltages 'Pha1' and 'Pha2' do not have to be linearly related to the phases, as long as the zero voltage difference corresponds to the zero phase difference and the relationship is monotonous.

It is to be noted that limiters can only be used in the phase correcting feedback circuit prior to the phase detection, not in the amplitude correcting feedback circuit, lest the power level information will be lost.

The bandwidth of the two feedback loops can be narrow with respect to the modulation, since it is sufficient to tune the corrective voltages according to the mean power.

While there have shown and described and pointed out fundamental novel features of the invention as applied to a preferred embodiment thereof, it will be understood that various omissions and substitutions and changes in the form and details of the devices and methods described may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. A transmitter comprising:
   a modulator providing a phase-modulated constant-envelope radio-frequency signal;
   a dividing unit dividing a signal provided by said modulator into a first signal and a second signal which are identical to each other;
   a first processing branch for processing a respective first signal provided by said dividing unit, said first processing branch comprising a first phase shifter and a first power amplifier connected to each other in series;
   a second processing branch for processing a respective second signal provided by said dividing unit, said second processing branch comprising a second phase shifter and a second power amplifier connected to each other in series;
   a combining unit combining signals provided by said first and said second processing branch;
   a first control arrangement for controlling the power of a signal output by said combining unit at least for higher power levels by controlling the amplifications applied by said first power amplifier and by said second power amplifier to a respectively received signal; and
   a second control arrangement for controlling the power of a signal output by said combining unit at least for lower power levels by controlling the phase shifts applied by said first phase shifter and by said second phase shifter to a respectively received signal.

2. The transmitter according to claim 1, wherein said first control arrangement controls said amplifications applied by said first power amplifier and by said second power amplifier to a respectively received signal based on a required amplitude modulation of said output signal and on a power level required for said output signal.

3. The transmitter according to claim 1, wherein said first control arrangement comprises a control signal generating unit, a power source and a linear regulator, said control signal generating unit generating a control signal representing a required amplitude modulation of said output signal and a power level required for said output signal, said linear regulator regulating a voltage supplied by said power source according to a control signal received from said control signal generating unit, and said linear regulator providing the same resulting voltage to a power supply input of said first power amplifier and to a power supply input of said second power amplifier for controlling the amplifications applied by said first power amplifier and by said second power amplifier.

4. The transmitter according to claim 1, wherein said first control arrangement comprises a control signal generating unit, a power source, a first linear regulator, a second linear regulator and a summing unit, said control signal generating unit generating a control signal representing a required amplitude modulation of said output signal and a power level required for said output signal, said summing unit summing a control signal provided by said control signal generating unit and an additional amplitude correction control signal, said first linear regulator regulating a voltage supplied by said power source according to a control signal received from said control signal generating unit and providing the resulting voltage to a power supply input of said first power amplifier for controlling the amplification applied by said first power amplifier, and said second linear regulator regulating a voltage supplied by said power supply unit according to a control signal received from said summing unit and providing the resulting voltage to a power supply input of said second power amplifier for controlling the amplification applied by said second power amplifier.

5. The transmitter according to claim 4, wherein said additional amplitude correction control signal is set to a constant value.

6. The transmitter according to claim 4, wherein said additional amplitude correction control signal is continuously adjusted according to a measured difference in amplitude between a signal output by said first processing branch and a signal output by said second processing branch.

7. The transmitter according to claim 1, wherein said second control arrangement controls said phase shifts applied by said first phase shifter and by said second phase shifter to a respectively received signal based on a required amplitude modulation of said output signal and on a power level required for said output signal.

8. The transmitter according to claim 1, wherein said second control arrangement comprises a control signal generating unit, a converting unit and an inverting unit, said control signal generating unit generating a control signal representing a required amplitude modulation of said output signal and a power level required for said output signal and said converting unit converting a control signal provided by said control signal generating unit into a phase control signal representing a corresponding phase, wherein said phase control signal is provided to a control input of said first phase shifter and via said inverter inverting said phase control signal to a control input of said second phase shifter.

9. The transmitter according to claim 8, further comprising a summing unit for summing a signal output by said inverter and an additional phase correction control signal, wherein only the resulting summed signal is provided to said control input of said second phase shifter.

10. The transmitter according to claim 9, wherein said additional phase correction control signal is set to a constant value.

11. The transmitter according to claim 9, wherein said additional phase correction control signal is continuously adjusted according to a measured difference in an absolute phase shift between a phase of a signal output by said modulator and a signal output by said first processing branch on the one hand and between said phase of said signal output by said modulator and a signal output by said second processing branch on the other hand.

12. The transmitter according to claim 1, said transmitter being an envelope elimination and restoration transmitter.

13. A method of controlling the power level of a signal output by a transmitter, said method comprising:
dividing a provided phase-modulated constant-envelope radio-frequency signal into a first signal and a second signal which are identical to each other;
controlling the power level of an output signal of said transmitter at least in case of higher required power levels by controlling amplifications applied separately to said first signal and to said second signal; and
controlling the power level of an output signal of said transmitter at least in case of lower required power levels by controlling phase shifts applied separately to said first signal and to said second signal; and
combining said processed first signal and said processed second signal and providing said combined signal as a power controlled output signal.

14. The method according to claim 13, wherein said amplifications, which are applied separately to said first and said second signal, are controlled based on a required amplitude modulation of said output signal and on a power level required for said output signal.

15. The method according to claim 13, wherein controlling the power level of an output signal of said transmitter by controlling amplifications applied separately to said first signal and to said second signal comprises:
generating a control signal representing a required amplitude modulation of said output signal and a power level required for said output signal;
regulating an available voltage according to said control signal; and
controlling said amplifications by providing the same regulated voltage as power supply to a first power amplifier amplifying said first signal and to a second power amplifier amplifying said second signal.

16. The method according to claim 13, wherein controlling the power level of an output signal of said transmitter by controlling amplifications applied separately to said first signal and to said second signal comprises:
generating a control signal representing a required amplitude modulation of said output signal and a power level required for said output signal;
regulating an available voltage according to said control signal to obtain a first regulated voltage;
controlling an amplification applied to said first signal by providing said first regulated voltage as power supply to a first power amplifier amplifying said first signal;
summing said control signal and an additional amplitude correction control signal;
regulating an available voltage according to said summed signal to obtain a second regulated voltage; and
controlling an amplification applied to said second signal by providing said second regulated voltage as power supply to a second power amplifier amplifying said second signal.

17. The method according to claim 16, wherein said additional amplitude correction control signal is set to a constant value.

18. The method according to claim 16, wherein said additional amplitude correction control signal is continuously adjusted according to a measured difference in amplitude between said processed first signal provided for combining and said processed second signal provided for combining.

19. The method according to claim 13, wherein said phase shifts, which are applied separately to said first and said second signal, are controlled based on a required amplitude modulation of said output signal and on a power level required for said output signal.

20. The method according to claim 13, wherein controlling the power level of an output signal of said transmitter by controlling phase shifts applied separately to said first signal and to said second signal comprises:
generating a control signal representing a required amplitude modulation of said output signal and a power level required for said output signal;
converting said control signal into a phase control signal representing a corresponding phase;
providing said phase control signal to a control input of a first phase shifter shifting said first signal in phase according to a signal provided to its control input; and
inverting said phase control signal and providing said inverted phase control signal to a control input of a second phase shifter shifting said second signal in phase according to a signal provided to its control input.

21. The method according to claim 20, further comprising summing said inverted phase control signal and an additional phase correction control signal, and providing only the resulting summed signal to said control input of said second phase shifter.

22. The method according to claim 21, wherein said additional phase correction control signal is set to a constant value.

23. The method according to claim 21, wherein said additional phase correction control signal is continuously adjusted according to a measured difference in an absolute phase shift between a phase of said provided phase-modulated constant-envelope radio-frequency signal and said processed first signal provided for combining on the one hand and between said phase of said provided phase-modulated constant-envelope radio-frequency signal and said processed second signal provided for combining on the other hand.

* * * * *